(12) United States Patent
Ruehle et al.

(10) Patent No.: US 6,685,113 B1
(45) Date of Patent: Feb. 3, 2004

(54) ACTUATOR

(75) Inventors: Wolfgang Ruehle, Ditzingen (DE); Hubert Stier, Asperg (DE); Matthias Boee, Ludwigsburg (DE); Guenther Hohl, Stuttgart (DE); Norbert Keim, Loechgau (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/868,963

(22) PCT Filed: Oct. 21, 2000

(86) PCT No.: PCT/DE00/03698

§ 371 (c)(1), (2), (4) Date: Sep. 26, 2001

(87) PCT Pub. No.: WO01/31187

PCT Pub. Date: May 3, 2001

(30) Foreign Application Priority Data

Oct. 22, 1999 (DE) .......................... 199 51 012

(51) Int. Cl.⁷ ................................. B05B 1/30
(52) U.S. Cl. .................... 239/585.1; 310/328; 310/344; 123/500
(58) Field of Search ................. 123/498, 458, 123/467, 500, 501; 239/585.1–585.5, 88–96; 310/328, 344, 337

(56) References Cited

U.S. PATENT DOCUMENTS

| | | | |
|---|---|---|---|
| 4,735,096 A | * 4/1988 | Dorr | ............................ 73/662 |
| 5,685,485 A | * 11/1997 | Mock et al. | ............. 239/102.2 |
| 6,079,636 A | * 6/2000 | Rembold et al. | ............. 239/88 |
| 6,172,445 B1 | * 1/2001 | Heinz et al. | ................. 310/328 |
| 6,278,658 B1 | * 8/2001 | Skinner et al. | ............. 367/161 |

FOREIGN PATENT DOCUMENTS

| | | | |
|---|---|---|---|
| DE | 4228974 | * | 3/1994 |
| DE | 4036287 | * | 4/1994 |
| DE | 195 34 445 | | 3/1997 |
| DE | 197 44 235 | | 4/1999 |
| GB | 2 270 198 | | 3/1994 |
| WO | 98/25060 | | 6/1998 |

\* cited by examiner

Primary Examiner—Carl S. Miller
(74) Attorney, Agent, or Firm—Kenyon & Kenyon

(57) ABSTRACT

An actuator (1), in particular for operation of fuel injectors in fuel injection systems of internal combustion engines, has in this embodiment a plurality of layers (2) of a piezoelectric or magnetostrictive material arranged in a stack. The actuator (1) is prestressed by a tie rod (6) arranged in a central recess (5) by way of opposing threads (7 and 8). Securing the device and the transfer of force are accomplished by a cover plate (3) and a bottom plate (4). The prestress can also be created by a sheathing (9) surrounding the actuator (1), which transfers an axial force component onto the layers (2) via the cover plate (3) and the bottom plate (4) by flanging of projecting ends (10).

14 Claims, 1 Drawing Sheet

ACTUATOR

FIELD OF THE INVENTION

The present invention is based on an actuator.

BACKGROUND INFORMATION

Conventionally, actuators for operation of fuel injectors in fuel injection systems of internal combustion engines are prestressed by a spring to prevent tensile stress. This spring prestress is generally produced by using the residual tension in the restoring spring of the valve even when the fuel injector is closed. Such an arrangement is described in German Patent No. 195 34 445, for example. The actuator sits on an abutment which is pressed against a pressure shoulder by the restoring spring.

One disadvantage of this design is that the spring prestress of the actuator cannot be preset. This results in damage to the component before or during installation. Since this actuator is not monolithic, but instead is composed of multiple piezoelectric or magnetostrictive ceramic layers, it is very sensitive to shearing forces, which can lead to very rapid destruction of the component.

SUMMARY

An actuator according to one example embodiment of the present invention has the advantage that by using a prestressing device, a variable actuator prestress is possible, the prestress being applied at the time of manufacture of the actuator, so the actuator is also not exposed to any tensile stress during assembly.

It is advantageous to install the actuator in the fuel injector in such a way that it is prestressed, because this prevents damage to the component.

Furthermore, the prestressing device can be implemented with a low manufacturing expense and practically no additional installation space.

Using a central tie rod for the prestressing device also offers the advantage that the prestressing device can be accommodated in a central recess in the actuator in a space-saving manner. This example embodiment protects the actuator from destruction due to shearing forces and allows prestressed installation of the actuator. The prestressing device can be implemented in a technically simple and inexpensive manner.

Using a flanged sheathing for the prestressing device also has the advantage of a space-saving design, but it offers better protection against forces acting during installation of the component due to the sheathing on the actuator. The flanging on the sheathing can be implemented easily and inexpensively.

DETAILED DESCRIPTION

Figure 1:
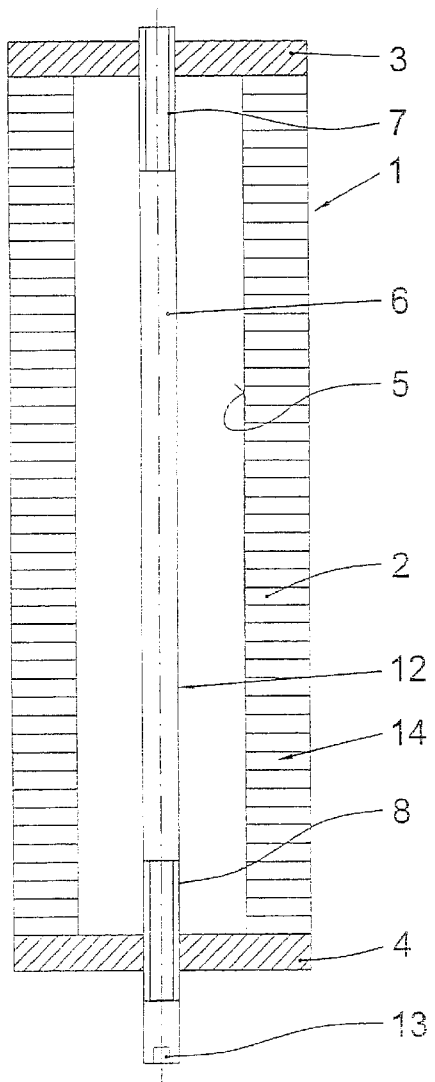
FIG. 1 shows an axial section through an actuator according to a first example embodiment of the present invention.

FIG. 1 shows an axial sectional diagram of a piezoelectric or magnetostrictive actuator 1 according to a first example embodiment of the present invention. Actuator 1 is used to operate a fuel injector, for example, in particular for direct injection of gasoline.

Actuator 1 has a piezoelectric or magnetostrictive element 14, which may be either monolithic or, as shown in FIG. 1, composed of disk-shaped piezoelectric or magnetostrictive layers 2. Layers 2 may be glued together. Actuator 1 has a cover plate 3 and a bottom plate 4 which seal off actuator 1 at the ends, are glued to layers 2, for example, and transmit the forces to layers 2.

In the embodiment illustrated in FIG. 1, actuator 1 has a central recess 5 with a tie rod 6 extending axially through it, connecting cover plate 3 to bottom plate 4 by friction locking. Tie rod 6 forming a prestressing device 12 may be rod shaped, e.g., designed as a threaded rod. Tie rod 6 is provided with a first thread 7 securing tie rod 6 in cover plate 3 and with a second thread 8 securing tie rod 6 in bottom plate 4. First thread 7 may be designed as a right-hand thread, second thread 8 may be designed as a left-hand thread.

The prestress of actuator 1 can be adjusted by turning tie rod 6. The distance between cover plate 3 and bottom plate 4 is increased or reduced in this way, thus producing a greater or lesser prestress of disk-shaped layers 2 accordingly.

A slotted groove 13 may be provided for a tool to act on tie rod 6. Tie rod 6 may be tubular in design to accommodate a valve needle or a pressure piston coaxially.

For use in a fuel injector (not shown), actuator 1 is surrounded by a valve housing on which cover plate 3, for example, is supported, while a valve needle guided in central recess 5 of actuator 1 has a valve closing body on the spray end, forming a sealing seat in conjunction with a valve seat face. The fuel injector may be designed as an outward opening fuel injector, for example.

When an electric voltage is supplied to actuator 1, piezoelectric element 14 expands and operates the valve needle by way of bottom plate 4 and a driver pin, for example, causing the valve closing body to be lifted up from the sealing seat so that fuel is sprayed.

Figure 2:
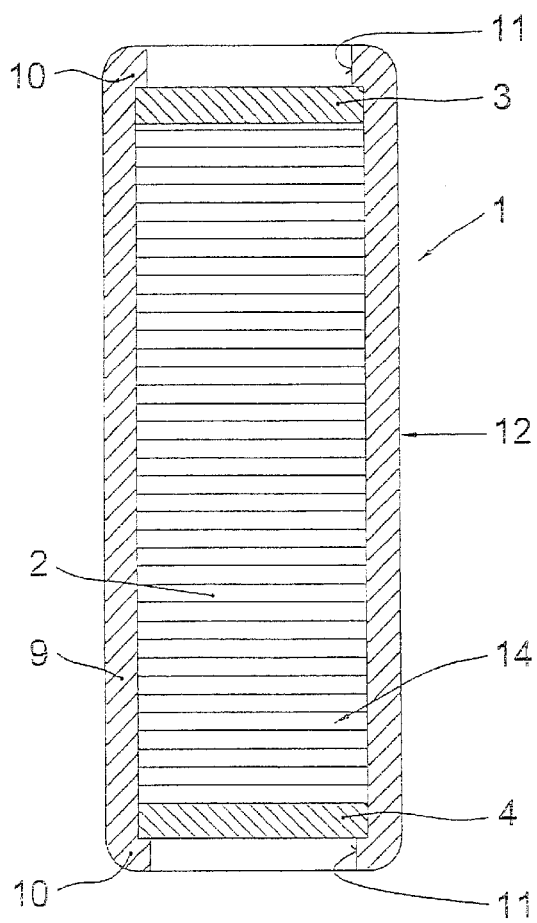
FIG. 2 shows an axial section through an actuator according to a second example embodiment of the present invention.

FIG. 2 shows an axial sectional diagram of a piezoelectric or magnetostrictive actuator 1 according to a second example embodiment of the present invention. Elements described previously are labeled with the same reference notation, so it is not necessary to describe them again.

As in the first embodiment, actuator 1 may have a monolithic or a layered design. Piezoelectric or magnetostrictive element 14 shown in FIG. 2 is composed of piezoelectric or magnetostrictive layers 2. Layers 2 in this embodiment are surrounded by a sheathing 9 which is flanged at its projecting ends 10 so that it surrounds the edge of cover plate 3 and bottom plate 4 and exerts an axial force component on cover plate 3 and bottom plate 4. This axial force component generates an axial prestress force in layers 2.

Due to the flanging, a recess 11 remains at the projecting ends 10 which can be used for connection to a pressure piston operated by cover plate 3 and bottom plate 4. For example, a valve needle or a piston of a hydraulic lifting device may be operated by bottom plate 4 to transmit the stroke exerted by the piezoelectric or magnetostrictive element on a valve closing body, e.g., to inject fuel into the combustion chamber of an internal combustion engine. Cover plate 3 is fixedly connected to a valve housing, for example.

The present invention is not limited to the embodiments illustrated here and can be used in particular in a variety of designs of fuel injectors.

What is claimed is:

1. An actuator for operation of a fuel injector in a fuel injection system of an internal combustion engine, comprising:
   one of: i) a piezoelectric element, or ii) a magnetostrictive element; and
   a prestressing device that axially surrounds the one of the piezoelectric element and magnetostrictive element to exert an axial prestressing force on the one of the piezoelectric element and magnetostrictive element.

2. The actuator according to claim 1, wherein the piezoelectric element or magnetostrictive element is composed of a plurality of layers arranged in a stack.

3. The actuator according to claim 2, wherein ends of the piezoelectric element or magnetostrictive element are sealed off by a cover plate and a bottom plate.

4. An actuator for operation of a fuel injector in a fuel injection system of an internal combustion engine, comprising:
   one of: i) a piezoelectric element, or ii) a magnetostrictive element; and
   a prestressing device that one of surrounds and passes through the one of the piezoelectric element and magnetostrictive element to exert an axial prestressing force on the one of the piezoelectric element and magnetostrictive element;
   wherein the piezoelectric element or magnetostrictive element is composed of a plurality of layers arranged in a stack;
   wherein ends of the piezoelectric element or magnetostrictive element are sealed off by a cover plate and a bottom plate; and
   wherein sheathing surrounds the layers.

5. An actuator for operation of a fuel injector in a fuel injection system of an internal combustion engine, comprising:
   one of: i) a piezoelectric element, or ii) a magnetostrictive element; and
   a prestressing device that one of surrounds and passes through the one of the piezoelectric element and magnetostrictive element to exert an axial prestressing force on the one of the piezoelectric element and magnetostrictive element;
   wherein the piezoelectric element or magnetostrictive element is composed of a plurality of layers arranged in a stack;
   wherein ends of the piezoelectric element or magnetostrictive element are sealed off by a cover plate and a bottom plate;
   wherein sheathing surrounds the layers; and
   wherein a projecting end of the sheathing is provided around the edge of the cover plate and the bottom plate by flanging so that an axial prestressing force is exerted on the layers arranged between the cover plate and the bottom plate.

6. An actuator for operation of a fuel injector, comprising:
   an actuator element including one of a piezoelectric element and a magnetostrictive element;
   a cover plate and a bottom plate for sealing off ends of the actuator element; and
   a sheathing surrounding the actuator element and including a first flange and a second flange, the first flange surrounding an edge of the cover plate and exerting a first axial force component on the cover plate, the second flange surrounding an edge of the bottom plate and exerting a second axial force component on the bottom plate.

7. The actuator according to claim 6, wherein the first flange forms a first recess adjacent to the cover plate and the second flange forms a second recess adjacent to the bottom plate.

8. The actuator according to claim 6, wherein the cover plate and the bottom plate are glued to the actuator element.

9. The actuator according to claim 6, wherein the sheathing completely surrounds the actuator element.

10. An actuator for operation of a fuel injector in a fuel injection system of an internal combustion engine, comprising:
    one of: i) a piezoelectric element, or ii) a magnetostrictive element; and
    a prestressing device that axially surrounds the one of the piezoelectric element and magnetostrictive element to exert an axial prestressing force on the one of the piezoelectric element and magnetostrictive element;
    wherein an outer surface of the prestressing device is substantially flat.

11. The actuator according to claim 10, wherein the piezoelectric element or magnetostrictive element is composed of a plurality of layers arranged in a stack.

12. The actuator according to claim 11, wherein ends of the piezoelectric element or magnetostrictive element are sealed off by a cover plate and a bottom plate.

13. An actuator for operation of a fuel injector in a fuel injection system of an internal combustion engine, comprising:
    one of: i) a piezoelectric element, or ii) a magnetostrictive element; and
    a prestressing device that one of surrounds and passes through the one of the piezoelectric element and magnetostrictive element to exert an axial prestressing force on the one of the piezoelectric element and magnetostrictive element; wherein an outer surface of the prestressing device is substantially flat;
    wherein the piezoelectric element or magnetostrictive element is composed of a plurality of layers arranged in a stack;
    wherein ends of the piezoelectric element or magnetostrictive element are sealed off by a cover plate and a bottom plate; and
    wherein sheathing surrounds the layers.

14. The actuator according to claim 13, wherein a projecting end of the sheathing is provided around the edge of the cover plate and the bottom plate by flanging so that an axial prestressing force is exerted on the layers arranged between the cover plate and the bottom plate.

* * * * *

UNITED STATES PATENT AND TRADEMARK OFFICE
CERTIFICATE OF CORRECTION

PATENT NO. : 6,685,113 B1
DATED : February 3, 2004
INVENTOR(S) : Wolfgang Ruehle et al.

It is certified that error appears in the above-identified patent and that said Letters Patent is hereby corrected as shown below:

Title page,
Item [57], ABSTRACT, delete "(1), (2), (1), (6), (5), (7 and 8), (3), (4), (9), (1), (2), (3), (4), (10)"

Signed and Sealed this

Fifteenth Day of February, 2005

JON W. DUDAS
*Director of the United States Patent and Trademark Office*